United States Patent
Imanaka

(10) Patent No.: US 12,130,332 B2
(45) Date of Patent: Oct. 29, 2024

(54) CURRENT MEASURING DEVICE AND ENERGY STORAGE APPARATUS

(71) Applicant: GS Yuasa International Ltd., Kyoto (JP)

(72) Inventor: Yuki Imanaka, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 136 days.

(21) Appl. No.: 17/757,374

(22) PCT Filed: Dec. 20, 2019

(86) PCT No.: PCT/JP2019/050109
§ 371 (c)(1),
(2) Date: Jun. 15, 2022

(87) PCT Pub. No.: WO2021/124551
PCT Pub. Date: Jun. 24, 2021

(65) Prior Publication Data
US 2023/0009467 A1    Jan. 12, 2023

(51) Int. Cl.
*G01R 31/382*    (2019.01)

(52) U.S. Cl.
CPC .................. *G01R 31/382* (2019.01)

(58) Field of Classification Search
CPC ..................... G01R 31/382; G01R 31/006; G01R 19/0084; G01R 31/52; B60L 3/0069;

(Continued)

(56) References Cited

U.S. PATENT DOCUMENTS

| 2010/0244847 A1 | 9/2010 | Kudo et al. |
| 2010/0327979 A1 | 12/2010 | Kanekawa et al. |

(Continued)

FOREIGN PATENT DOCUMENTS

| JP | 2001-118607 A | 4/2001 |
| JP | 2002-257909 A | 9/2002 |

(Continued)

OTHER PUBLICATIONS

International Search Report and Written Opinion for International Application No. PCT/JP2019/050109, dated Mar. 10, 2020, (12 pages), Japan Patent Office, Tokyo, Japan.

*Primary Examiner* — Huy Q Phan
*Assistant Examiner* — Trung Q Nguyen
(74) *Attorney, Agent, or Firm* — Alston & Bird LLP

(57) ABSTRACT

A current measurement device 50 for measuring the current of a power storage element comprises a measurement resistor unit 80 that is positioned on a current path and comprises a resistor 81, a pair of detection points Pa, Pb that are positioned on the current path on both sides of the resistor 81, a current detection unit 160 that comprises a pair of voltage input units 161A, 161B that are connected to the pair of detection points Pa, Pb and detects the current of the power storage element from the voltage difference between the pair of detection points, and a ground connection point Pg that is connected to a common ground GND with the current detection unit 160. The resistance Rga along the current path X to the ground connection point Pg from the detection point Pa from among the pair of detection points Pa, Pb that is closest to the ground connection point Pg is smaller than the value obtained by dividing the input voltage tolerance Vm of the current detection unit 160 by a prescribed current of the power storage element.

8 Claims, 15 Drawing Sheets

(58) Field of Classification Search
CPC ....... B60L 3/0046; B60L 3/0023; H02H 3/17; H02H 3/325
USPC ...... 324/415–417, 425–437, 76.11, 500, 600
See application file for complete search history.

(56) References Cited

U.S. PATENT DOCUMENTS

| | | | |
|---|---|---|---|
| 2011/0276295 A1* | 11/2011 | Gaben | G01R 31/396 702/85 |
| 2013/0106449 A1 | 5/2013 | Kikuchi | |
| 2014/0015533 A1 | 1/2014 | Rink et al. | |
| 2014/0159734 A1* | 6/2014 | Knill | G01R 19/0092 324/426 |
| 2014/0159739 A1 | 6/2014 | Kudo et al. | |
| 2014/0370754 A1 | 12/2014 | Kameko et al. | |
| 2016/0109484 A1 | 4/2016 | Sato et al. | |
| 2016/0303977 A1 | 10/2016 | Kudo et al. | |
| 2018/0105043 A1* | 4/2018 | Migita | H02M 3/155 |
| 2020/0028219 A1* | 1/2020 | Lee | G01R 35/00 |
| 2021/0190832 A1 | 6/2021 | Liu | |
| 2022/0120823 A1* | 4/2022 | Nakayama | B60L 3/0069 |

FOREIGN PATENT DOCUMENTS

| | | |
|---|---|---|
| JP | 2007-132806 A | 5/2007 |
| JP | 2009-282050 A | 12/2009 |
| JP | 2011-012964 A | 1/2011 |
| JP | 2011-196723 A | 10/2011 |
| JP | 2013-096782 A | 5/2013 |
| JP | 2013-152231 A | 8/2013 |
| JP | 2014-509747 A | 4/2014 |
| JP | 2015-021815 A | 2/2015 |
| JP | 2016-118437 A | 6/2016 |
| JP | 201945152 A | 3/2019 |
| WO | WO-2013/121872 | 8/2013 |

* cited by examiner

CURRENT MEASURING DEVICE AND ENERGY STORAGE APPARATUS

CROSS REFERENCE TO RELATED APPLICATIONS

This application is a national stage application, filed under 35 U.S.C. § 371, of International Application No. PCT/JP2019/050109, filed Dec. 20, 2019, the contents of which as are hereby incorporated by reference in their entirety.

BACKGROUND

Technical Field

The present invention relates to a device for measuring a current of an energy storage device.

Description of Related Art

A measuring resistor such as a shunt resistor is sometimes used as one of the current measuring devices of energy storage devices. Patent Document JP-A-2015-021815 describes that a ground terminal is provided for a shunt resistor.

BRIEF SUMMARY

The current measuring device includes a current detection unit that detects a current from the voltage difference of the resistor. The input voltage of the current detection unit has an allowable value. Since the input voltage exceeding the allowable value is saturated by the allowable value, the measurement accuracy of the current decreases.

An object of the present invention is to suppress saturation of an input voltage and improve the measurement accuracy of a current.

A current measuring device that measures a current of an energy storage device includes a measuring resistor positioned on a current path and having a resistor, a pair of detection points located on both sides of the resistor on the current path, a current detection unit including a pair of voltage input units connected to the pair of detection points and configured to detect a current of the energy storage device from a voltage difference between the pair of detection points, and a ground connection point connected to a common ground common to the current detection unit. The resistance of the current path from one of the pair of detection points which is close to the ground connection point to the ground connection point is smaller than a value obtained by dividing an allowable value of an input voltage of the current detection unit by a predetermined current of the energy storage device.

The present technology can be applied to an energy storage apparatus.

The current measurement accuracy can be improved.

Figure 1:
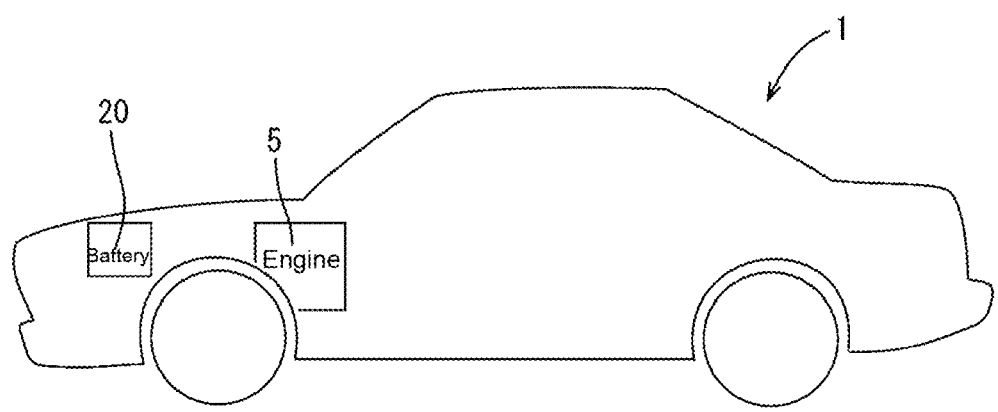
FIG. 1 is a side view of an automobile applied to a first embodiment.

DETAILED DESCRIPTION OF VARIOUS EMBODIMENTS (Outline of Current Measuring Device)

As a result of studying to improve the current measurement accuracy and the SOC estimation accuracy of the energy storage device, the inventors have found that when the input voltage of the current detection unit exceeds an allowable value, the current detection unit is saturated and the measurement accuracy decreases.

A current measuring device that measures a current of an energy storage device includes a measuring resistor positioned on a current path and having a resistor, a pair of detection points located on both sides of the resistor on the current path, a current detection unit including a pair of voltage input units connected to the pair of detection points and configured to detect a current of the energy storage device from a voltage difference between the pair of detection points, and a ground connection point connected to a common ground common to the current detection unit. The resistance of the current path from one of the pair of detection points which is close to the ground connection point to the ground connection point is smaller than a value obtained by dividing an allowable value of an input voltage of the current detection unit by a predetermined current of the energy storage device.

When the energy storage device has a predetermined current or less, the voltage at at least one of the detection points does not exceed the allowable value of the input voltage of the current detection unit. Since the saturation of the input voltage does not occur at at least one of the detection points, a current measurement error can be suppressed.

The resistance of the current path from one of the detection points to the ground connection point may be smaller than the value obtained by dividing the voltage obtained by subtracting a voltage across the resistor at a predetermined current from the allowable value of the input voltage of the current detection unit by the predetermined current.

When the energy storage device has a predetermined current or less, the saturation of the input voltage does not occur at both of a pair of detection points, so that the current measurement accuracy can be further enhanced.

The measuring resistor may include a pair of electrodes on both sides of the resistor, the pair of electrodes may include a pair of the detection points, and one of the pair of electrodes may include the ground connection point in addition to one of the detection points.

Providing one detection point and the ground connection point for one electrode shortens the distance from the one detection point to the ground connection point and makes it possible to reduce the resistance from the one detection point to the ground connection point. By reducing the resistance, it is possible to suppress a voltage rise at the detection point and suppress the saturation of the input voltage.

The ground connection point may be common to one of the detection points, and the resistance of a current path between two common points may be zero. Since the resistance between the two points becomes zero, it is possible to suppress an increase in the voltage at the detection point with respect to the ground and to suppress the saturation of the input voltage.

The measuring resistor may include a pair of detection terminals corresponding to the pair of detection points and a ground terminal corresponding to the ground connection point, and the pair of detection terminals and the ground terminal may be fitted to a connector provided on a substrate. Since thermal resistance exists between each terminal and the connector, heat is less likely to be transferred as compared with a case where the measuring resistor and the substrate are connected by a harness. Even if the measuring resistor generates heat, the influence on the substrate can be reduced.

The predetermined current may be the maximum current. Even when the energy storage device has the maximum current, it is possible to suppress the saturation of the input voltage and to suppress the measurement error of the current.

First Embodiment

1. Electrical Configuration of Battery

FIG. 1 is a side view of an automobile. An automobile 1 is an engine driven vehicle and includes an engine 5 as a driving device. FIG. 1 illustrates only the engine 5 and a battery 20 and omits other parts constituting the automobile 1. The battery 20 is an example of an energy storage apparatus.

The electrical configuration of the battery 20 will be described with reference to FIG. 2. The battery 20 is for starting the engine. A starter motor 15 for starting the engine 5 mounted on the automobile 1 and an IG switch 17 are connected to the battery 20.

When the IG switch 17 is turned on, a current flows from the battery 20 to the starter motor 15, and the starter motor 15 is driven. The engine 5 can be started by driving the starter motor 15.

In addition to the starter motor 15, a vehicle load (not illustrated) such as an electrical component and an alternator (not illustrated) are connected to the battery 20. When the power generation amount of the alternator is larger than the power consumption of the vehicle load, the battery 20 is charged by the alternator. When the amount of power generated by the alternator is smaller than the power consumption of the vehicle load, the battery 20 is discharged to make up for the shortage.

The battery 20 includes an assembled battery 30, a measuring resistor 80, a current breaker 120, a management unit 130, a signal processing circuit 150, and a circuit board 90. The assembled battery 30 includes a plurality of secondary batteries 31 connected in series. The secondary battery 31 is, for example, a lithium ion secondary battery.

The assembled battery 30, the current breaker 120, and the measuring resistor 80 are connected in series via power lines 55P and 55N. The power lines 55P and 55N are current paths X of the assembled battery 30.

The power line 55P is a power line that connects an external terminal 22P of the positive electrode and the positive electrode of the assembled battery 30. The power line 55N is a power line that connects an external terminal 22N of the negative electrode and the negative electrode of the assembled battery 30.

The current breaker 120 is located on the positive electrode side of the assembled battery 30 and is provided in the power line 55P on the positive electrode side.

Figure 3:
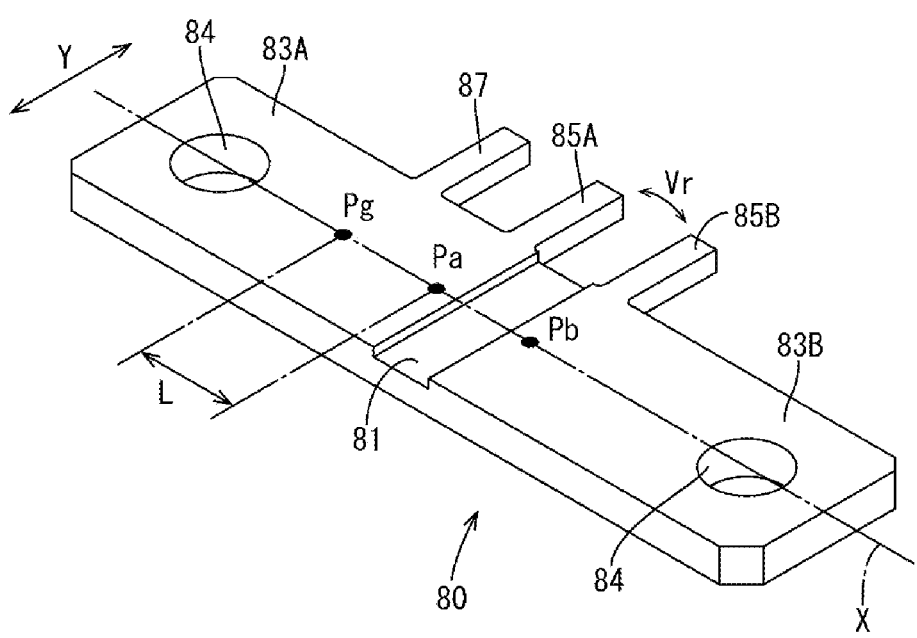
FIG. 3 is a perspective view of a resistor.

The measuring resistor 80 is located at the negative electrode of the assembled battery 30 and is provided in the power line 55N on the negative electrode side. As illustrated in FIG. 3, the measuring resistor 80 is a rectangular metal conductor elongated in one direction (the direction of the current path X). The measuring resistor 80 includes a pair of electrodes 83A and 83B and a resistor 81.

The resistor 81 is an alloy (for example, an alloy of copper, manganese, and nickel: Manganin) having a small temperature change rate of electric resistance. The resistor 81 generates a voltage Vr proportional to the current flowing through the measuring resistor 80.

The pair of electrodes 83A and 83B is, for example, a metal such as copper. The pair of electrodes 83A and 83B is located on both sides of the resistor 81 in the X direction and is joined to the resistor 81 by welding. As a welding method, electron beam welding, resistance welding, or the like can be used.

The pair of electrodes 83A and 83B has screw holes 84 for bus bar attachment. The electrode 83A is connected to the negative electrode of the assembled battery 30 by a bus bar (not illustrated), and the electrode 83B is connected to the external terminal 22N of the negative electrode by a bus bar (not illustrated).

The pair of electrodes 83A and 83B has a pair of detection points Pa and Pb. The pair of detection points Pa and Pb is located on both sides of the resistor 81 on the current path X.

The pair of electrodes 83A and 83B includes a pair of detection terminals 85A and 85B corresponding to the pair of detection points Pa and Pb. The pair of detection terminals 85A and 85B protrude parallel to the Y direction orthogonal to the current path X from the side surfaces of the electrodes 83A and 83B. The detection terminal 83A of the electrode 85A is at the position of the detection point Pa of the current path X, and the detection terminal 83B of the electrode 85B is at the position of the detection point Pb of the current path X. The pair of detection points Pa and Pb is electrically connected to two input terminals 161A and 161B of a first signal processing unit 160, respectively, via the detection terminals 85A and 85B and a connector 100.

The measuring resistor 80 has a ground connection point Pg. The ground connection point Pg is on the electrode 83A and is adjacent to the detection point Pa. The ground connection point Pg is a far point located outside the detection point Pa as viewed from the resistor 81. The ground connection point Pg is located between the detection point Pa and the negative electrode of the assembled battery 30 on the current path X (see FIG. 2).

As illustrated in FIG. 3, the electrode 83A includes a ground terminal 87 corresponding to the ground connection point Pg. The ground terminal 87 protrudes from the side surface of the electrode 83A in the Y direction orthogonal to the current path X. The ground terminal 87 is parallel to the detection terminals 85A and 85B. The ground terminal 87 of the electrode 83A is located at the position of the ground connection point Pg of the current path X. The ground connection point Pg is electrically connected to a common ground GND of the circuit board 90 via the ground terminal 87 and the connector 100.

The current breaker 120 is a relay or a semiconductor switch such as a FET. The current of the battery 20 can be cut off by bringing the current breaker 120 into an OPEN state. The current breaker 120 is normally controlled to a CLOSE state.

Figure 2:
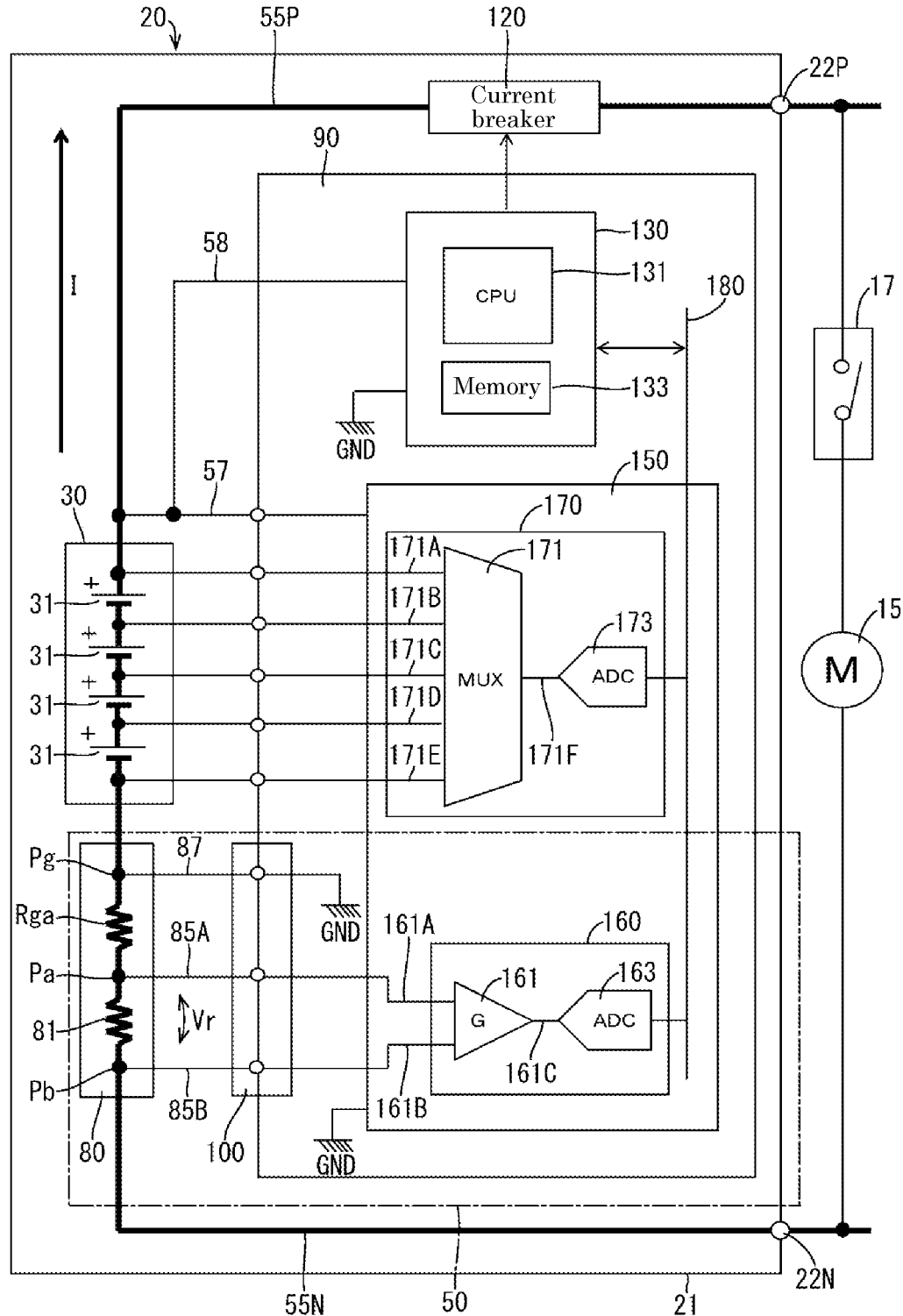
FIG. 2 is a block diagram illustrating the electrical configuration of a battery.

As illustrated in FIG. 2, the signal processing circuit 150 is mounted on the circuit board 90 and includes the first signal processing unit 160 and a second signal processing unit 170. The signal processing circuit 150 is connected to the power line 55P on the positive electrode side via a branch line 57 and receives power supply from the assembled battery 30 as a power source. The signal processing circuit 150 is electrically connected to the common ground GND of the circuit board 90.

The first signal processing unit 160 includes amplifier 161 and an AD converter 163. The amplifier 161 includes two input terminals 161A and 161B and one output terminal 161C.

The two input terminals 161A and 161B are electrically connected to the two detection points Pa and Pb located on both sides of the resistor 81, respectively, via the connector 100 and the detection terminals 85A and 85B.

The amplifier 161 amplifies the voltage difference between the two input terminals 161A and 161B, that is, the end-to-end voltage Vr of the resistor 81. The amplifier 161 is a detection unit that detects the end-to-end voltage Vr of the resistor 81. The AD converter 163 is connected to the output terminal 161C of the amplifier 161, converts an output value of the amplifier 161 from an analog signal to a digital signal, and outputs the converted signal. The first signal processing unit 160 is an example of a current detection unit that detects a current I of the battery 20 from the voltage difference Vr between the two input terminals 161A and 161B.

The measuring resistor 80, the connector 100, and the first signal processing unit 160 constitute an example of the current measuring device 50.

The second signal processing unit 170 includes a multiplexer 171 and an AD converter 173. The multiplexer 171 includes five input terminals 171A to 171E and one output terminal 171F. The five input terminals 171A to 171E are electrically connected to the electrodes of the secondary batteries 31, respectively.

The multiplexer 171 sequentially detects and outputs the voltages of the secondary batteries 31 while switching the secondary batteries 31 to be measured. The AD converter 173 is connected to the output terminal 171F of the multiplexer 171, converts an output value of the multiplexer 171 from an analog signal to a digital signal, and outputs the converted signal.

The first signal processing unit 160 and the second signal processing unit 170 are connected to the management unit 130 via a bus 180, and outputs (measurement values) of both the signal processing units 160 and 170 are input to the management unit 130.

As illustrated in FIG. 2, the management unit 130 is mounted on the circuit board 90. The management unit 130 includes a CPU 131 and a memory 133. The management unit 130 is connected to the power line 55P on the positive electrode side via a branch line 58 and receives power supply from the assembled battery 30 as a power source. The management unit 130 is connected to the common ground GND of the circuit board 90.

The CPU 131 monitors the current I of the battery 20 based on the output of the first signal processing unit 160. The CPU 131 monitors the voltage of each secondary battery 31 and the total voltage of the assembled battery 30 based on the output of the second signal processing unit 170.

When there is an abnormality in the voltage, current, or temperature of the secondary battery 31, the CPU 131 sends a command to the current breaker 120 to interrupt the current I, thereby protecting the battery 20.

The SOC (state of charge) is the state of charge of the battery 20. The SOC is the ratio of a residual capacity to a full charge capacity (actual capacity) and can be defined by the following Equation (1).

$$SOC[\%]=(Cr/Co)\times 100 \tag{1}$$

where Co is the full charge capacity of the secondary battery, and Cr is the residual capacity of the secondary battery.

The CPU 131 estimates the SOC of the battery 20 based on the integral value of the current I measured by the measuring resistor 80 with respect to the time as expressed by Equation (2) given below.

$$SOC=SOCo+100\times(\int I dt)/Co \tag{2}$$

where SOCo is the initial value of the SOC and I is the current.

2. Description of Structure of Battery 20

Figure 4:
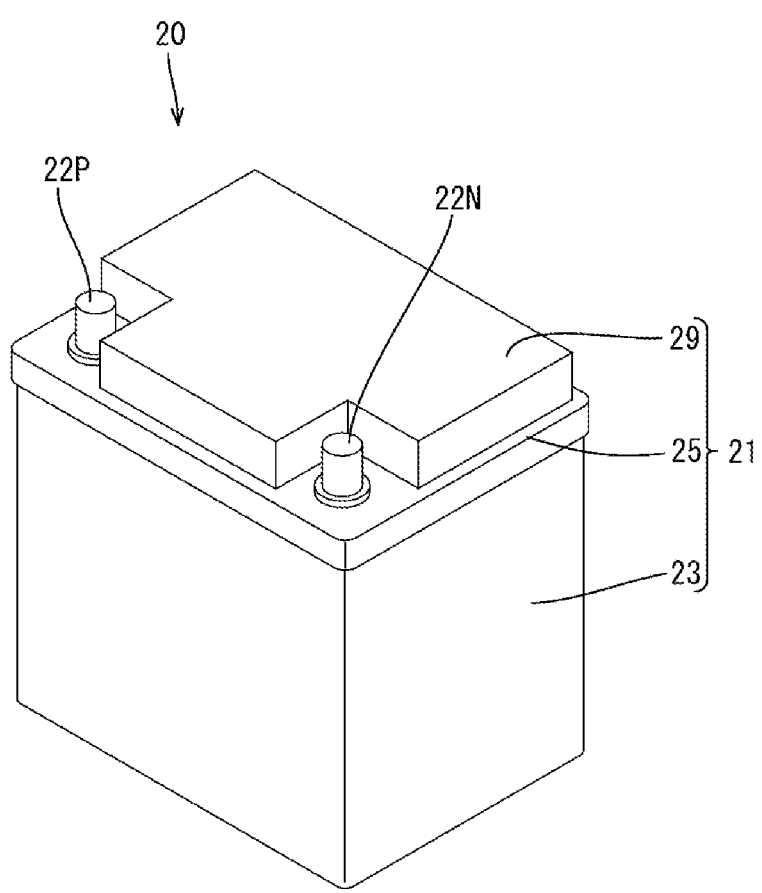
FIG. 4 is a perspective view of the battery.
Figure 5:
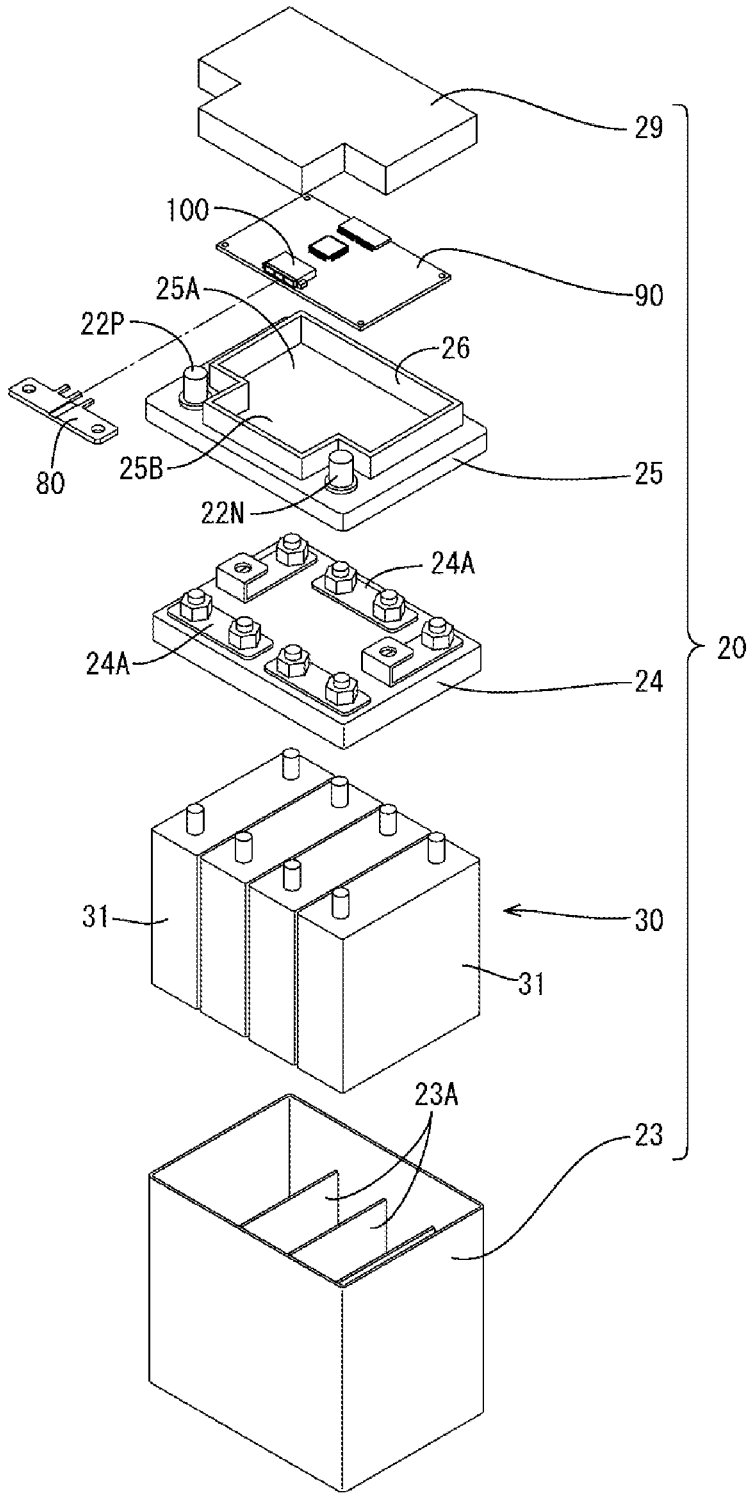
FIG. 5 is an exploded perspective view of the battery.

FIG. 4 is a perspective view of the battery. FIG. 5 is an exploded perspective view of the battery. As illustrated in FIG. 4, the battery 20 has a block-shaped battery case 21. In the battery case 21 accommodates the assembled battery 30 including the plurality of secondary batteries 31, the measuring resistor 80, the current breaker 120, the circuit board 90, and the like.

As illustrated in FIG. 5, the battery case 21 includes a box-shaped case body 23 that opens upward, a positioning member 24 that positions the plurality of secondary batteries 31, and an inner lid 25 mounted on the upper portion of the case body 23, and an upper lid 29 mounted on the upper portion of the inner lid 25. In the case body 23, a plurality of cell chambers 23A are provided side by side in the X direction. Each of the secondary batteries 31 is individually accommodated in each of the cell chambers 23A.

The positioning member 24 positions each secondary battery 31 accommodated in each cell chamber 23A. As illustrated in FIG. 5, a plurality of bus bars 24A are disposed on the upper surface of the positioning member 24. The plurality of bus bars 24 connect the secondary batteries 31 housed in the cell chambers 23A in series.

The inner lid 25 has a substantially rectangular shape in plan view, as shown in FIG. 5. The inner lid 25 has a pair of external terminals 22P and 22N at both ends in the X direction. The pair of external terminals 22P and 22N are made of, for example, a metal such as a lead alloy, and 22P is the external terminal of the positive electrode and 22N is the external terminal of the negative electrode. The external terminals 22P and 22N are terminals for connecting the battery 20 to an electric load such as the starter motor 15.

Figure 6:
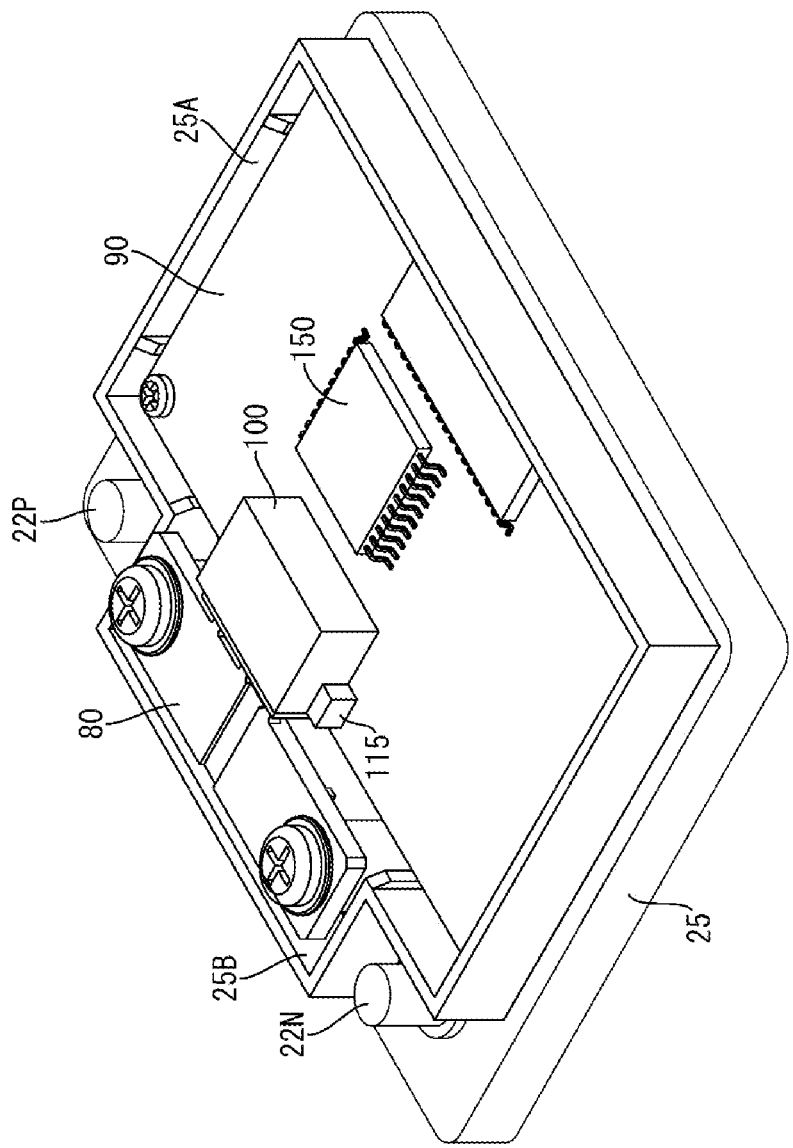
FIG. 6 is a perspective view of an inner lid.

As illustrated in FIG. 5, a first accommodating portion 25A and a second accommodating portion 25B are provided on the upper surface of the inner lid 25. These two accommodating portions 25A and 25B are surrounded by an outer wall 26. As illustrated in FIG. 6, the circuit board 90 is accommodated in the first accommodating portion 25A in a state of being fixed by screwing. FIG. 6 illustrates only a portion of the circuit board 90 such as the connector 100 and the signal processing circuit 150 and omits the other components.

The circuit board 90 has a substantially rectangular shape, and the connector 100 is disposed on an upper surface of the circuit board. The connector 100 is disposed at a facing portion facing the measuring resistor 80. The connector 100 is fixed to the upper surface of the circuit board 90 by a fixing portion 115 such as a claw.

The connector 100 has three internal terminals (illustration is omitted). That is, the two internal terminals correspond to the two detection terminals 85A and 85B provided in the measuring resistor 80, and one internal terminal corresponds to the ground terminal 87. Each internal terminal is joined to a conductor pattern provided on the upper surface of the circuit board 90 by, for example, soldering.

Figure 7:
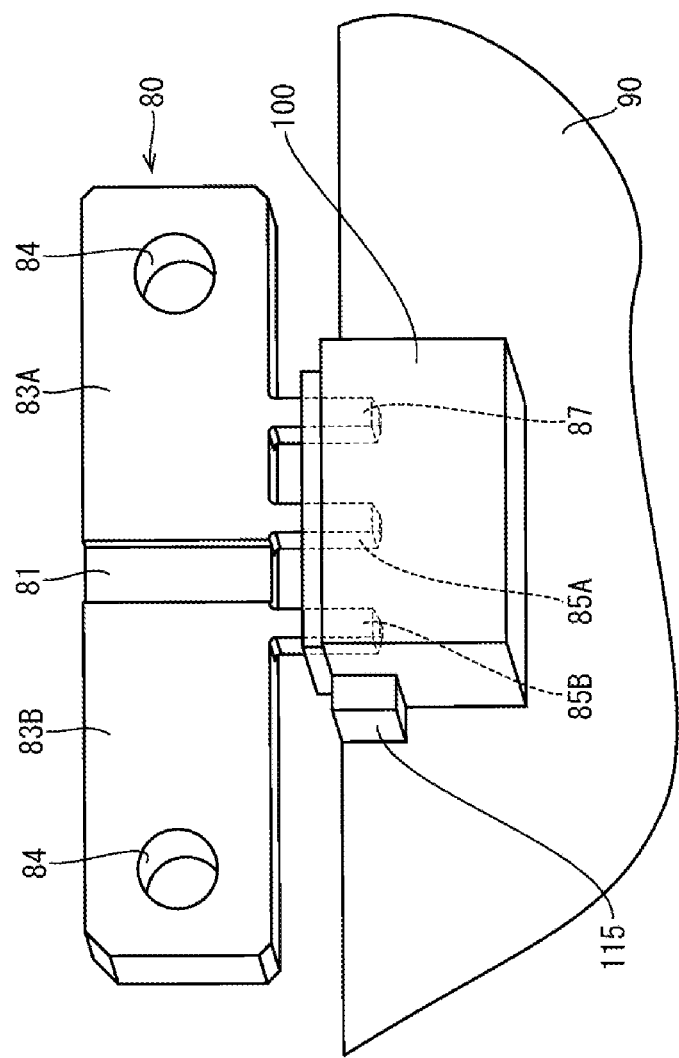
FIG. 7 is a perspective view illustrating a state in which a resistor is fitted to the connector of a circuit board.

As illustrated in FIG. 6, the measuring resistor 80 is accommodated in the second accommodating portion 25B. The measuring resistor 80 accommodates the two electrodes 83A and 83B in a screwed state while the two detection terminals 85A and 85B and the ground terminal 87 are fitted to the connector 100 (see FIG. 7).

When the detection terminals 85A and 85B are fitted to the connector 100, the detection terminals 85A and 85B are in elastic contact with the internal terminals and can be electrically connected to the first signal processing unit 160 mounted on the circuit board 90.

When the ground terminal 87 is fitted to the connector 100, the ground terminal 87 of the measuring resistor 80 is in elastic contact with the internal terminal and can be electrically connected to the common ground GND of the circuit board 90.

Since thermal resistance exists between each of the terminals 85A, 85B, and 87 and the connector 100, heat is less likely to be transferred as compared with a case where the measuring resistor 80 and the circuit board 90 are connected by a harness. Accordingly, even if the measuring resistor 80 generates heat, the influence on the circuit board 90 can be reduced.

3. Input Voltage of First Signal Processing Unit 160 and Current Measurement Error The magnitude of the input voltage of the amplifier 161 is limited. When a voltage exceeding the allowable value Vm is input to the amplifier 161, the amplifier 161 is saturated, and a measurement error occurs in the measurement value of the first signal processing unit 160.

The allowable value Vm of the input voltage is, for example, ±300 mV. Note that + indicates discharging, and − indicates charging. When the voltage at the detection point Pa is +310 [mV] and the voltage at the detection point Pb is +330 [mV], the input voltage to the amplifier 161 is saturated at +300 [mV] at both of the two detection points Pa and Pb, resulting in a measurement error. That is, although the potential difference between the two detection points Pa and Pb is correctly +20 [mV], the potential difference is measured as 0.

The ground connection point Pg of the measuring resistor 80 is connected to the common ground GND of the circuit board 90 and has the same potential as the common ground GND of the circuit board 90.

By setting the ground connection point Pg to the same potential as the common ground GND, the reference potential difference between the measuring resistor 80 and the circuit board 90 can be reduced, and the voltages at the detection points Pa and Pb based on the common ground GND can be reduced.

Figure 8:
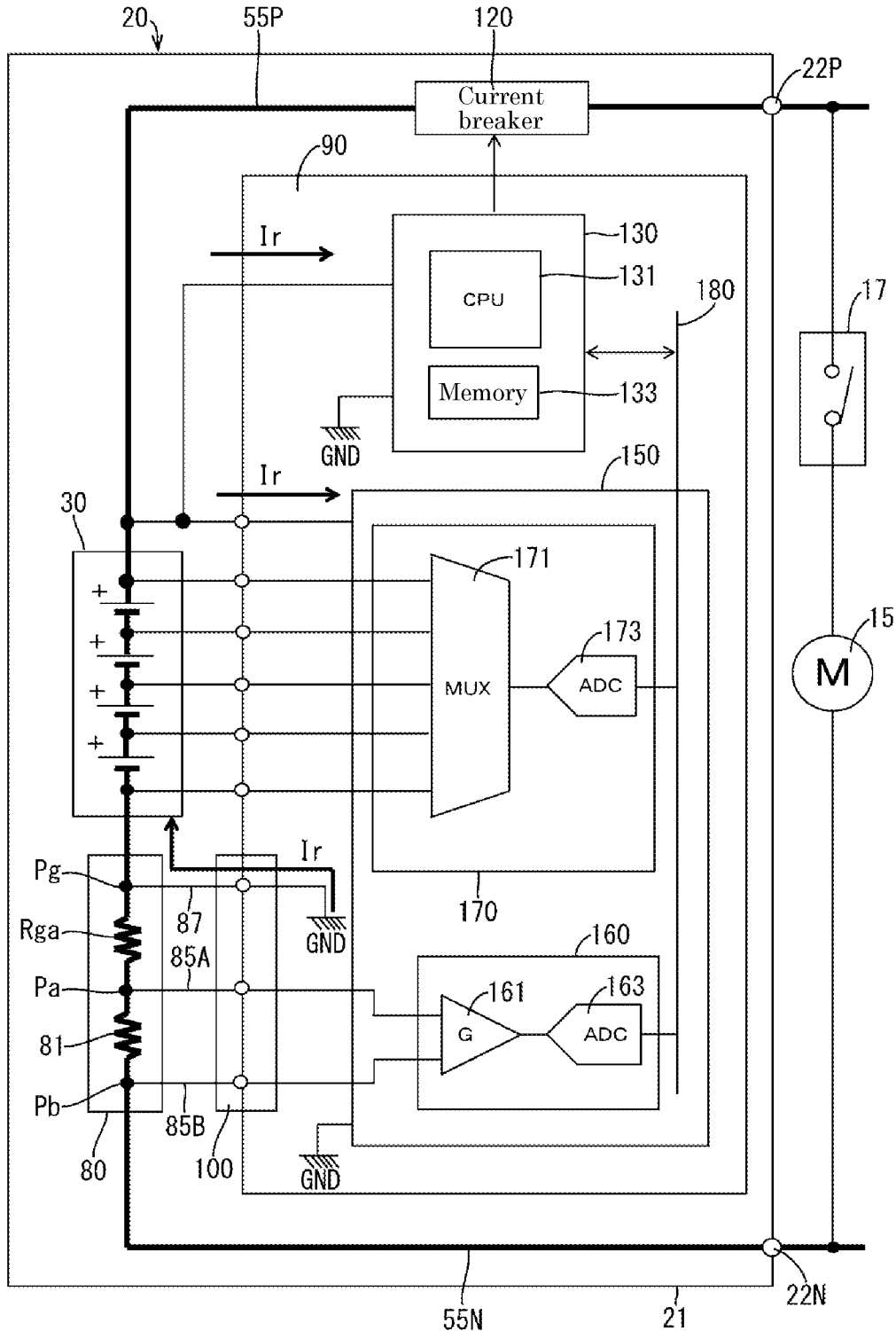
FIG. 8 is a diagram illustrating the current path of a consumption current.

In a case where the ground terminal 87 is provided separately from the detection terminals 85A and 85B, as illustrated in FIG. 8, a consumption current Ir of the management unit 130 or the signal processing circuit 150 is fed back to the assembled battery 30 through the ground terminal 87. Therefore, the consumption current Ir does not flow through the detection terminals 85A and 85B, and it is possible to suppress a decrease in current measurement accuracy.

In a case where the ground connection point Pg and the detection point Pa are separately provided for the electrode 83A, when a current flows through the measuring resistor 80, a voltage is generated between the ground connection point Pg and the detection point Pa. The reason why the voltage is generated is that the electrodes 83A and 83B are made of copper, and the material itself has electric resistance. That is, a voltage is generated between the two points Pg and Pa by the resistance from the ground connection point Pg to the detection point Pa.

When the electrical resistivity of the electrode 83A is ρ [Ωm], the cross-sectional area of the electrode 83A is S [m²], and the length along the current path X from the ground connection point Pg to the detection point Pa is L [m], the resistance Rga [Ω] of the current path X from the ground connection point Pg to the detection point Pa is obtained by Equation (3) given below.

$$Rga = \rho \times L/S \quad (3)$$

The resistance Rga of the current path X from the ground connection point Pg to the detection point Pa satisfies Inequality (4) given below and is equal to or less than the numerical value obtained by dividing the allowable value Vm of the input voltage of the first signal processing unit 160 by the maximum current Imax of the battery 20.

$$Rga \leq Vm/Imax \quad (4)$$

where Vm is the allowable value of the input voltage of the first signal processing unit (amplifier), and Imax is the maximum current of the battery 20. The maximum current Imax is the maximum value of the current that the battery 20 can discharge or charge in a short time. The maximum current Imax is the numerical value determined by characteristics (electromotive force, internal resistance, and the like) of the battery 20, and a design value or an experimental value can be used.

When the allowable value Vm of the input voltage of the first signal processing unit 160 is ±300 [mV] and the maximum current ±Imax of the battery 20 is 6000 [A], Rga≤50 [μΩ] is satisfied. Note that + indicates discharging, and − indicates charging.

The resistance Rga is proportional to the length L along the current path X from the ground connection point Pg to the detection point Pa and is inversely proportional to a cross-sectional area S of the electrode 83A, as indicated by Equation (3). Therefore, in the measuring resistor 80, the length L along the current path X from the ground terminal 87 to the detection terminal 85A and the cross-sectional area S of the electrode 83A are determined such that the resistance Rga satisfies Inequality (4).

In a case where the resistance Rga satisfies Inequality (4) given above, even if the battery 20 has the maximum current Imax, the voltage of the detection terminal 85A does not exceed the allowable value Vm of the input voltage of the first signal processing unit 160. Therefore, the saturation of the input voltage does not occur at one of the two detection points Pa and Pb which is close to the ground connection point Pg, that is, the detection point Pa. If the input voltage is not saturated at both the detection point Pa and the detection point Pb, there is almost no current measurement error due to saturation, and the current measurement accuracy can be improved. Even when the input voltage is saturated at the detection point Pb, the voltage difference between the two detection points Pa and Pb does not become zero because the detection point Pa is not saturated. Therefore, at both the two detection points Pa and Pb, the current measurement error due to the saturation can be suppressed as compared with the case where the input voltage is saturated.

3. Description of Effects

The battery 20 can suppress measurement errors concerning the current I due to the excess of the input voltage to the first signal processing unit 160 and can enhance the measurement accuracy of the current I. In addition, since the measurement accuracy of the current I is improved, the SOC estimation accuracy is also improved.

Second Embodiment

The second embodiment is different from the first embodiment in the value of a resistance Rga of a current path X from a ground connection point Pg to a detection point Pa.

The resistance Rga satisfies Inequality (5) given below and is equal to or less than the numerical value obtained by dividing the voltage obtained by subtracting a maximum value Vrmax of an end-to-end voltage Vr of a resistor 81 from an allowable value Vm of the input voltage of a first signal processing unit 160 by a maximum current Imax of a battery 20.

$$Rga \leq (Vm - Vrmax)/Imax \quad (5)$$

where Vm is the allowable value of the input voltage of the first signal processing unit, Vrmax is the maximum voltage of the resistor 81, and Imax is the maximum current of the battery 20. Vrmax is the product of the resistance value of the resistor 81 and the maximum current Imax of the battery 20.

In a case where the allowable value Vm of the input voltage of the first signal processing unit 160 is ±300 [mV], the maximum voltage Vrmax of the resistor 81 is ±150 [mV], and the maximum current Imax of the battery 20 is ±6000 [A], Rga≤25 [μΩ] is satisfied.

In a case where the resistance Rga satisfies Inequality (5) given above, even if the battery 20 has the maximum current Imax, the voltage of a detection terminal 85B does not exceed the allowable value Vm of the input voltage of the first signal processing unit 160 as well as the voltage of the detection terminal 85A. Since the saturation of the input voltage does not occur at both of the two detection points Pa and Pb, the current measurement accuracy can be enhanced.

Other Embodiments

The present invention is not limited to the embodiments described with reference to the above description and the drawings. For example, the following embodiments are also included in the technical scope of the present invention.

(1) In the first and second embodiments, the energy storage device is the secondary battery 31. The secondary battery 31 is not limited to a lithium ion secondary battery and may be another nonaqueous electrolyte secondary battery. A lead-acid battery or the like can also be used. The energy storage device is not limited to the secondary battery 31 and may be a capacitor. The energy storage devices are not limited to a configuration in which the plurality of energy storage devices are connected in series-parallel combination and may be configured to be connected in series. Alternatively, a single cell configuration may be used.

(2) In the first and second embodiments, the battery 20 is used for a vehicle. The use of the battery 20 is not limited to an engine-driven vehicle. The battery 20 can be used for various purposes such as for moving objects (for vehicles, ships, AGVs, and the like) and for stationary uses (energy storage apparatuses for uninterruptible power supply systems and solar power generation systems).

(3) In the first and second embodiments, the first signal processing unit 160 includes the amplifier 161 and the AD converter 163. The first signal processing unit 160 may have any configuration as long as it has two voltage input terminals and detects the current of the battery 20 from the voltage difference between the two voltage input terminals. For example, an amplifier and a comparator may be used. The magnitude of a current may be detected from the output value of the amplifier using a comparator.

(4) In the first embodiment, the resistance Rga is defined by the maximum current Imax of the battery 20. The resistance Rga may be defined by the rated current of the battery 20. That is, the allowable value Vm of the input voltage of the first signal processing unit 160 may be set to a value smaller than the value obtained by dividing the allowable value Vm by the rated current of the battery 20 (the current limit within which the battery 20 can be safely used). The resistance Rga can be defined by a predetermined current of the battery 20. The predetermined current is the maximum current or rated current of the battery. The same applies to Inequality (5) in the second embodiment.

(5) In the first and second embodiments, the management unit 130 is provided inside the battery 20. The battery 20 only needs to include at least the assembled battery 30 and the signal processing circuit 150, and the management unit 130 may be provided outside the battery 20.

(6) In the first and second embodiments, the ground connection point Pg of the measuring resistor 80 is connected to the common ground GND via the ground terminal 87. The ground connection point Pg of the measuring resistor 80 may be connected to the common ground GND using a harness. In this case, a screw hole for fixing the harness terminal to the ground connection point Pg may be provided in the measuring resistor 80.

(7) In the first and second embodiments, the ground connection point Pg is provided in the measuring resistor 80. The ground connection point may be located anywhere on the current path X of the assembled battery 30. The ground connection point may be located in a place other than the measuring resistor 80.

Figure 9:
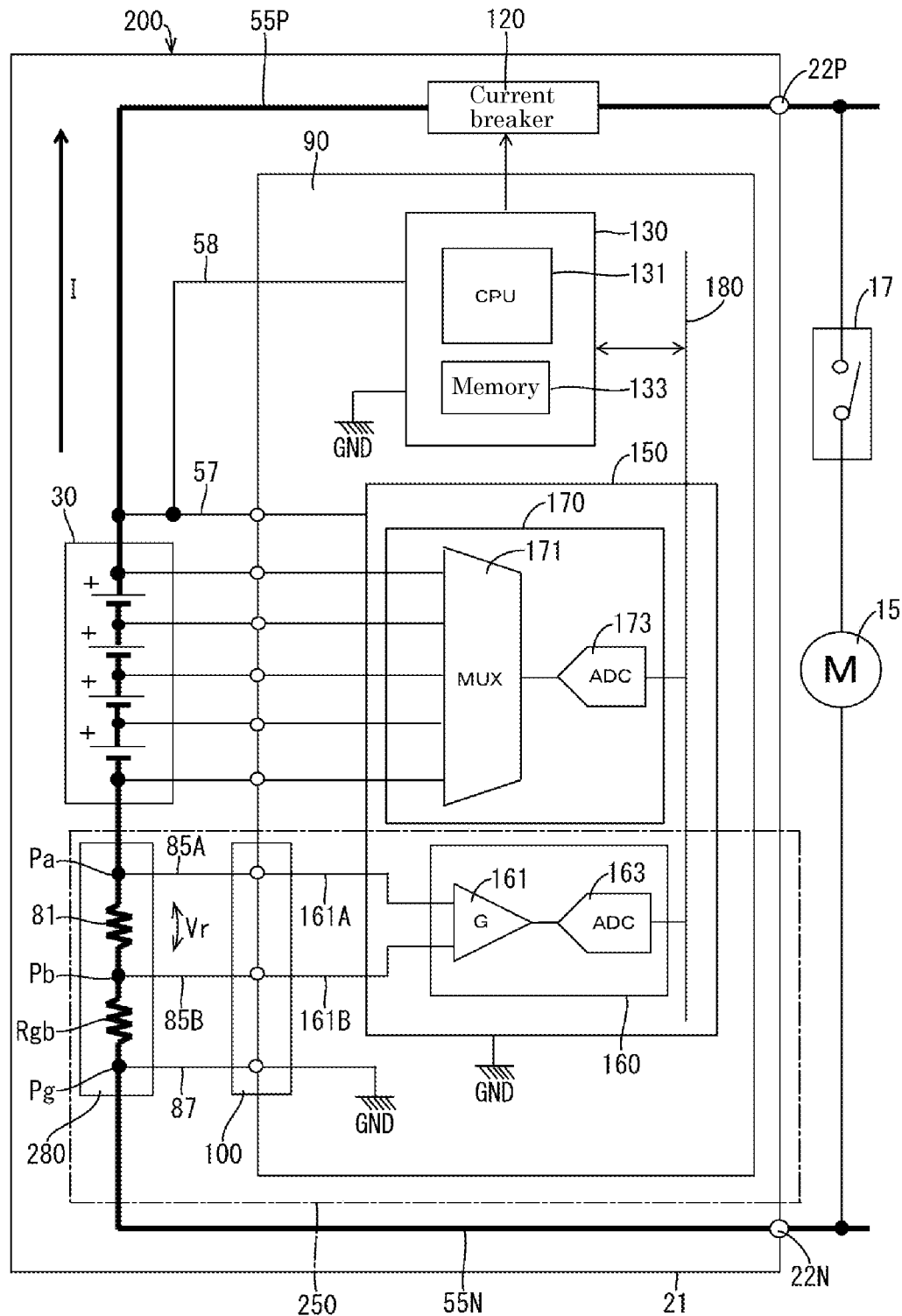
FIG. 9 is a block diagram illustrating the electrical configuration of the battery.

(8) In the first and second embodiments, the ground connection point Pg is provided between the negative electrode of the assembled battery 30 and the resistor 81. The ground connection point Pg may be provided between the resistor 81 and the external terminal 22N of the negative electrode. A battery 200 illustrated in FIG. 9 includes a current measuring device 250. The current measuring device 250 includes a measuring resistor 280, a connector 100, and a first signal processing unit 160. The measuring resistor 280 has a ground connection point Pg provided between the resistor 81 and the external terminal 22N of the negative electrode. In this case, the resistance Rgb of the current path X from the ground connection point Pg to the detection point Pb preferably satisfies Inequality (4) in the first embodiment or Inequality (5) in the second embodiment.

Figure 10:
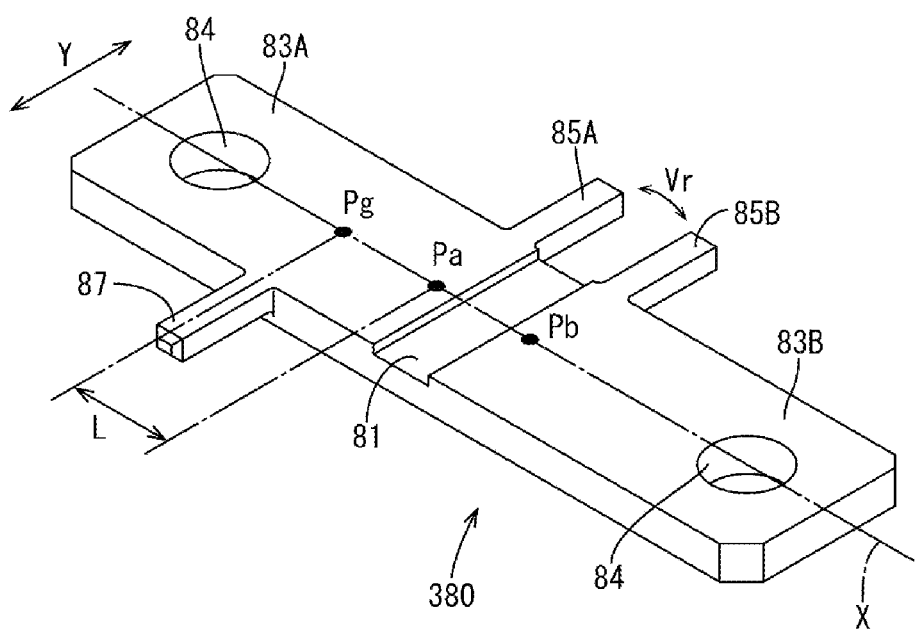
FIG. 10 is a perspective view illustrating another embodiment of the resistor.

(9) In the first and second embodiments, the ground terminal 87 is provided in the measuring resistor 80 along with the detection terminals 85A and 85B. When Rga≤Vm/Imax is satisfied, the ground terminal 87 may be provided anywhere in the measuring resistor 80. In a measuring resistor 380 illustrated in FIG. 10, the position of the ground terminal 87 is different from that of the measuring resistor 80 illustrated in FIG. 3, and the ground terminal 87 is provided on the long side opposite to the long side on which the detection terminals 85A and 85B are provided among the two long sides of the measuring resistor 380. The ground terminal 87 may be provided on a short side of the measuring resistor 380.

(10) In the first and second embodiments, the measuring resistor 80 is disposed on the negative electrode side of the assembled battery 30 but may be disposed on the positive electrode side as long as it is on the current path of the assembled battery 30.

Figure 11:
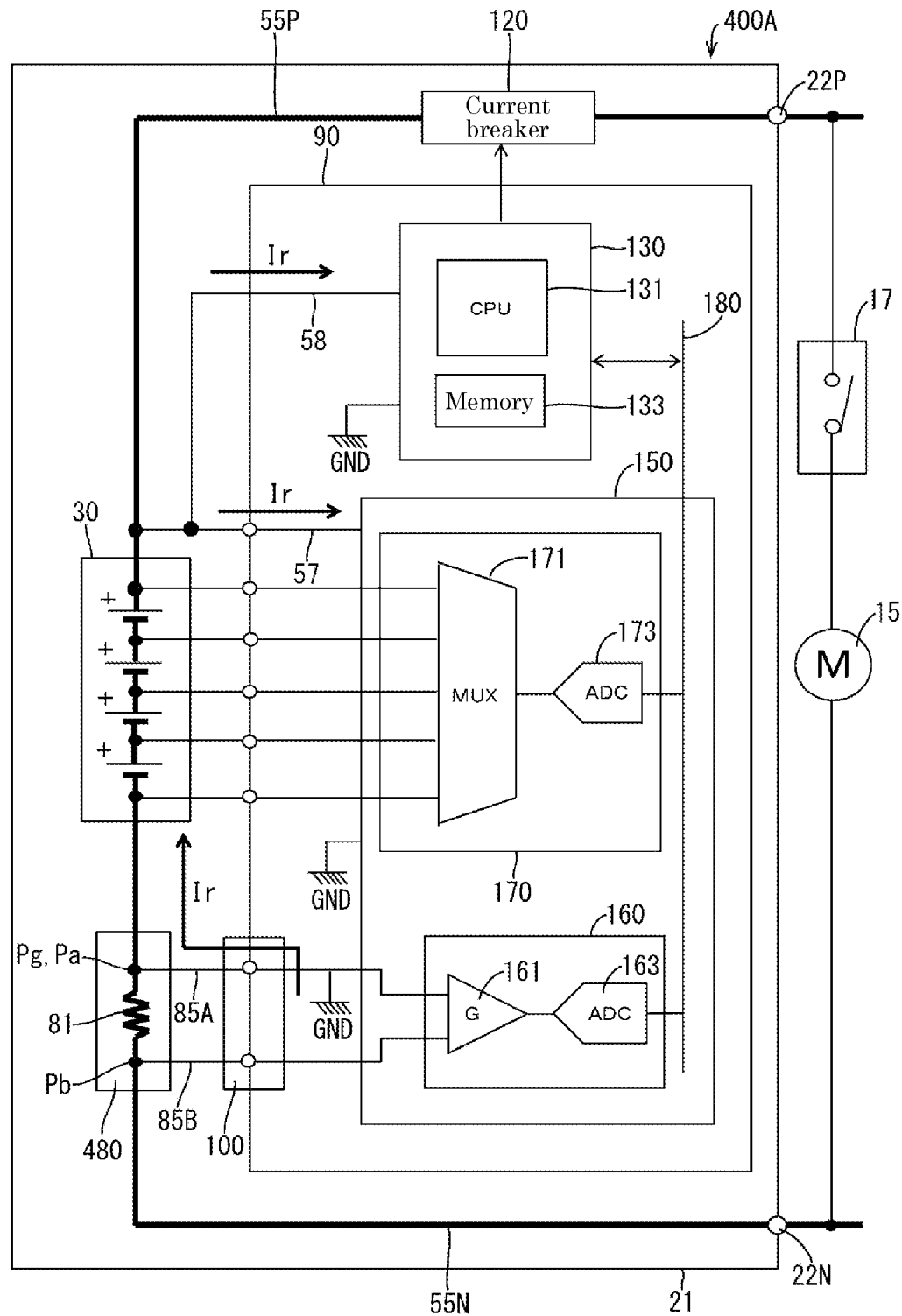
FIG. 11 is a block diagram illustrating another embodiment of the battery.

(11) FIG. 11 is a circuit diagram of a battery 400A. The battery 400A differs from the battery 20 in how the measuring resistor 480 is grounded. More specifically, the measuring resistor 480 shares the ground connection point Pg with one detection point Pa.

When the ground connection point Pg and the detection point Pa are common, the common two points Pg and Pa have the same potential, and the resistance of the current path X between the two points Pg and Pa is zero. Therefore, it is possible to suppress a voltage rise at the detection points Pa and Pb with respect to the common ground GND, and hence it is possible to suppress the saturation of the input voltage of the amplifier 161.

Figure 12:
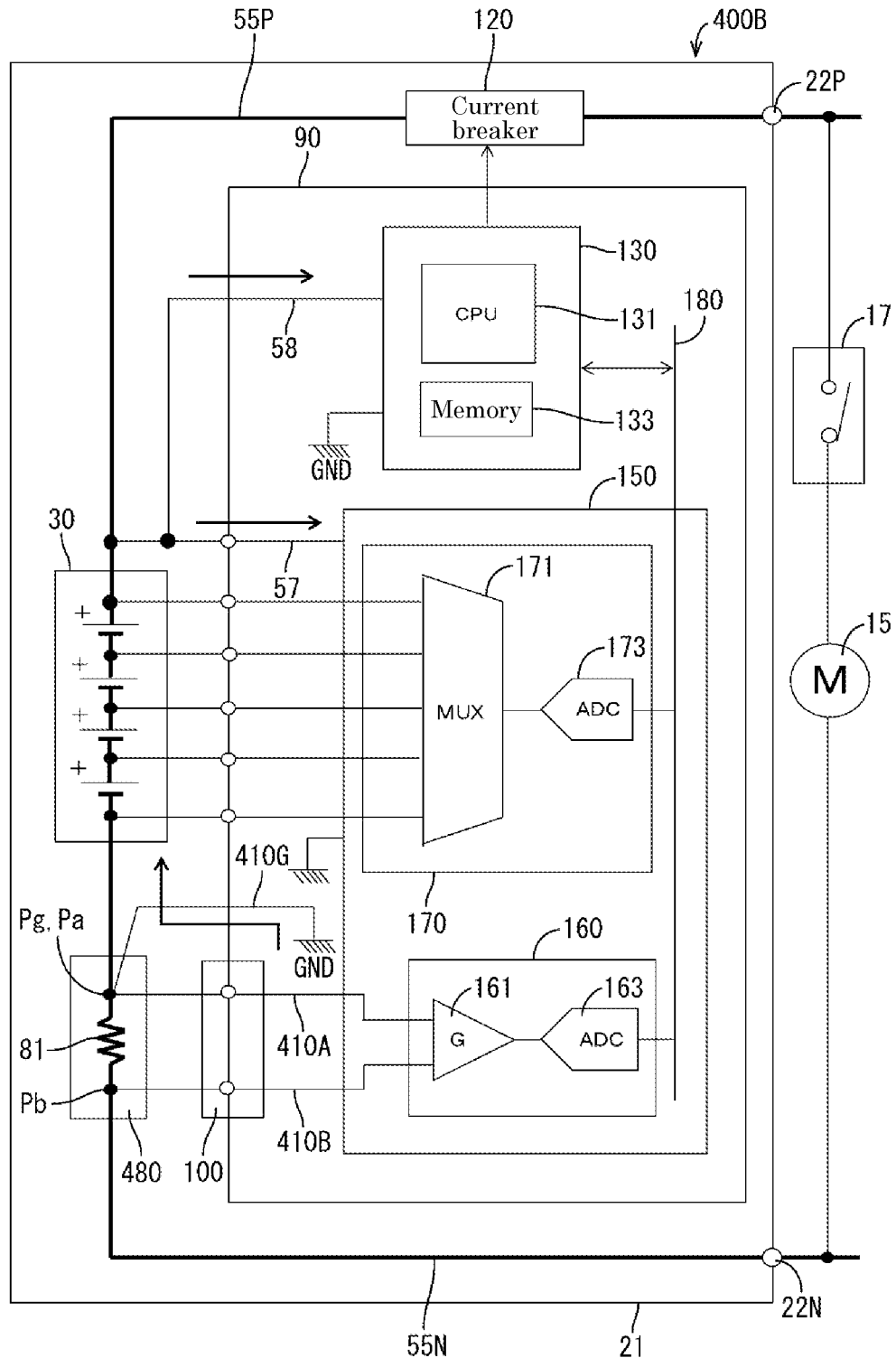
FIG. 12 is a block diagram illustrating another embodiment of the battery.

(12) FIG. 12 is a circuit diagram of a battery 400B. The battery 400B is the same as the battery 400A in that a ground connection point Pg is common to a detection point Pa but is different in that a ground line 410G of a measuring resistor 480 is provided separately from an input line 410A to the amplifier 161.

By providing the ground line 410G separately from the input line 410A, the consumption current Ir of the management unit 130 or the signal processing circuit 150 returns to the assembled battery 30 via the ground line 410G and does not pass through the input line 410A. Therefore, since there is no current measurement error due to the consumption current Ir, there is an advantage that the current measurement accuracy is high.

Figure 13:
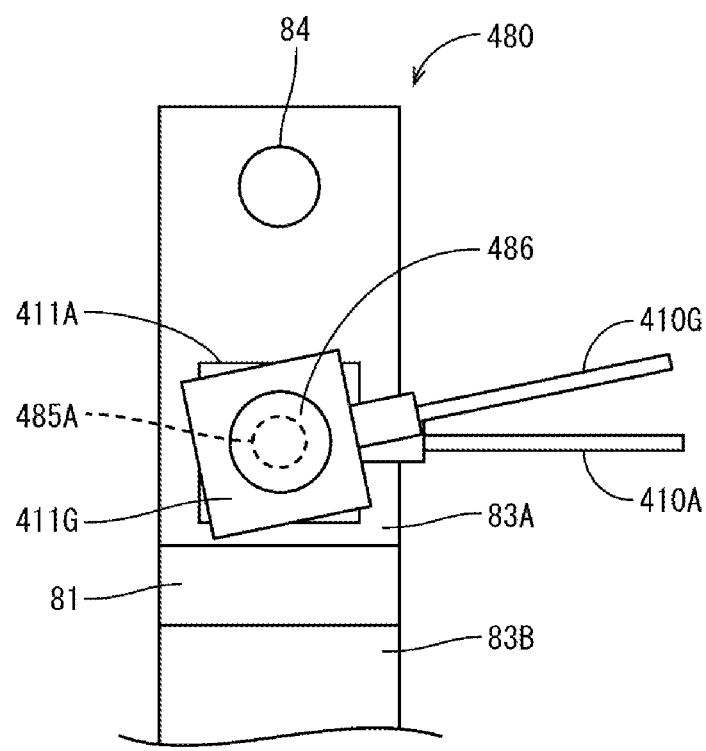
FIG. 13 is a diagram illustrating the connection structure of a ground line and an input line to a measuring resistor.

When the ground line 410G is provided separately from the input line 410A, the two lines 410G and 410A may be commonly connected to a connection hole 485A provided at the detection point Pa as illustrated in FIG. 13. For example, common connection may be performed by a fastener such as a screw 486. A terminal 411A is a terminal of an input line 410A, and a terminal 411G is a terminal of a ground line 410G.

Figure 14:
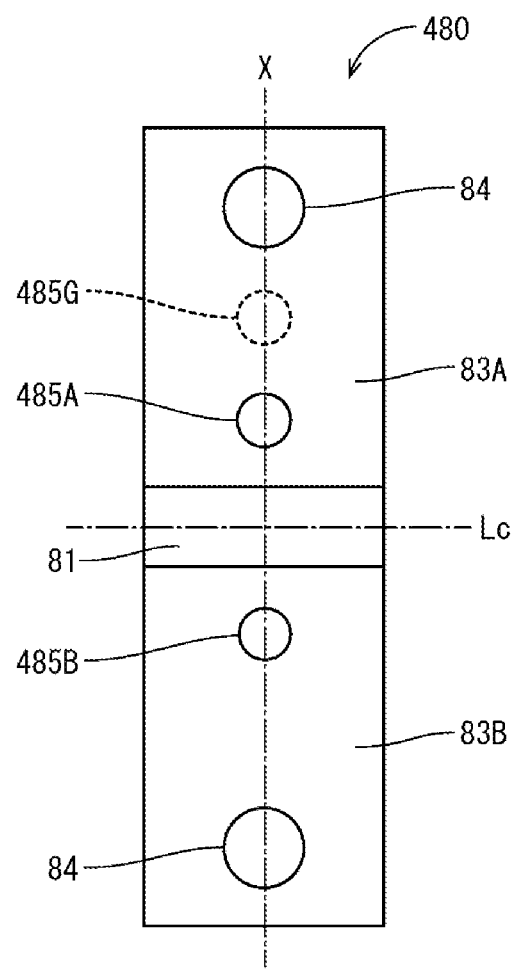
FIG. 14 is a plan view illustrating another embodiment of the measuring resistor.

(13) FIG. 14 is a plan view of the measuring resistor 480. The measuring resistor 480 has a connection hole 485A at the detection point Pa and a connection hole 485B at the detection point Pb. The two connection holes 485A and 485B are for connecting the input lines 410A and 410B to the amplifier 161. The two connection holes 485A and 485B may be symmetric with respect to a center line Lc of the resistor 81. Symmetrically arranging the two connection holes 485A and 485B makes it possible to accurately detect the voltage across the resistor 81 and improve the current measurement accuracy. The ground line 410G may be commonly connected to the connection hole 485A, or a dedicated connection hole 485G may be provided and connected separately from the input line 410A. The measuring resistor 480 has the screw holes 84 at both ends. However, the screw holes may be omitted by commonly using the connection holes 485A and 485B as the screw holes.

Figure 15:
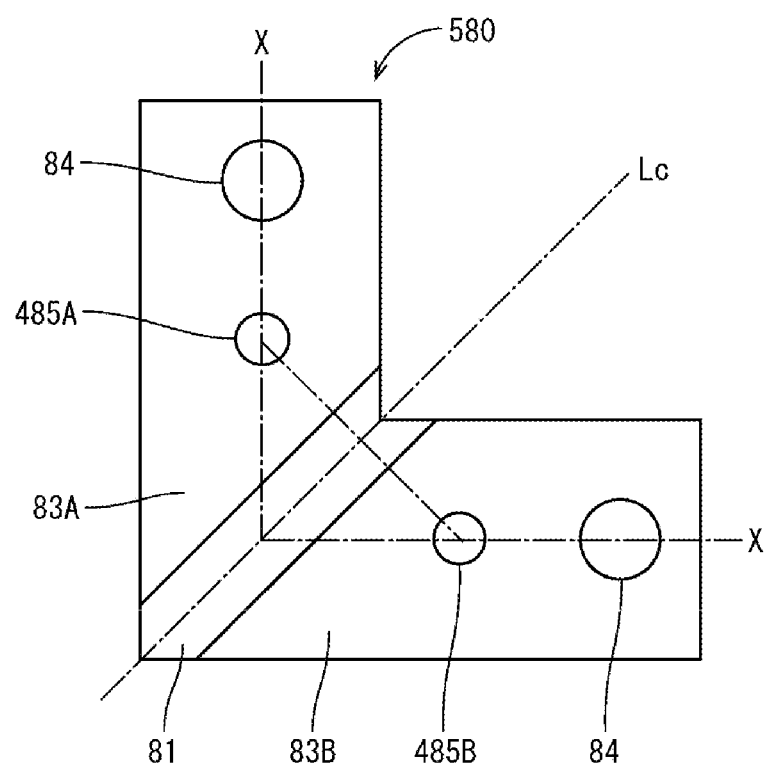
FIG. 15 is a plan view illustrating another embodiment of the measuring resistor.

(14) FIG. 15 is a plan view of a measuring resistor 580. The measuring resistor 580 is different from the measuring resistor 480 in that the outer shape is an L shape and the current path X is not a straight line. When the current path X is not a straight line, the two connection holes 485A and 485B can be arranged symmetrically with respect to the center line Lc by inclining the center line Lc of the resistor 81 with respect to the current path X. The same applies to the screw hole 84 for attaching the bus bar.

The invention claimed is:

1. A current measuring device that measures a current of an energy storage device, the current measuring device comprising:
    a measuring resistor positioned on a current path and having a resistor;
    a pair of detection points located on both sides of the resistor on the current path;
    a current detection unit including a pair of voltage input units connected to the pair of detection points and configured to detect a current of the energy storage device from a voltage difference between the pair of detection points; and
    a ground connection point connected to a common ground common to the current detection unit,
    wherein:
        a resistance of the current path from one of the pair of detection points which is close to the ground connection point to the ground connection point is smaller than a value obtained by dividing an allowable value of an input voltage of the current detection unit by a predetermined current of the energy storage device; and
        a resistance of the current path from the one detection point to the ground connection point is smaller than a value obtained by dividing a voltage obtained by subtracting a voltage across the resistor at a predetermined current from the allowable value of the input voltage of the current detection unit by the predetermined current.

2. The current measuring device according to claim 1, wherein
    the measuring resistor has a pair of electrodes on both sides of the resistor, and
    the pair of electrodes includes a pair of the detection points, and
    one of the pair of electrodes has the ground connection point in addition to the one detection point.

3. The current measuring device according to claim 2, wherein the ground connection point is common to one of the detection points, and a resistance of a current path between two common points is zero.

4. The current measuring device according to claim 3, wherein
    the measuring resistor includes a pair of detection terminals corresponding to the pair of detection points and a ground terminal corresponding to the ground connection point, and
    the pair of detection terminals and the ground terminal are fitted to a connector provided on a substrate.

5. The current measuring device according to claim 2, wherein
   the measuring resistor includes a pair of detection terminals corresponding to the pair of detection points and a ground terminal corresponding to the ground connection point, and
   the pair of detection terminals and the ground terminal are fitted to a connector provided on a substrate.

6. The current measuring device according to claim 1, wherein the predetermined current is a maximum current.

7. An energy storage apparatus comprising:
   an energy storage device; and
   the current measuring device according to claim 1.

8. The current measuring device according to claim 1, wherein
   the measuring resistor has a pair of electrodes on both sides of the resistor, and
   the pair of electrodes includes a pair of the detection points, and
   one of the pair of electrodes has the ground connection point in addition to the one detection point.

\* \* \* \* \*